United States Patent [19]

Lien

[11] Patent Number: 5,777,510
[45] Date of Patent: Jul. 7, 1998

[54] HIGH VOLTAGE TOLERABLE PULL-UP DRIVER AND METHOD FOR OPERATING SAME

[75] Inventor: Chuen-Der Lien, Los Altos Hills, Calif.

[73] Assignee: Integrated Device Technology, Inc., Santa Clara, Calif.

[21] Appl. No.: 604,277

[22] Filed: Feb. 21, 1996

[51] Int. Cl.$^6$ .......................... H01L 27/02; H01L 27/78
[52] U.S. Cl. .......................... 327/565; 327/566; 327/546; 327/433; 327/108; 257/370
[58] Field of Search .................... 327/564, 565, 327/566, 433, 108, 544, 546, 365, 442, 112; 257/370, 372, 373, 378

[56] References Cited

U.S. PATENT DOCUMENTS

| | | |
|---|---|---|
| 4,035,826 | 7/1977 | Morton et al. ............ 327/566 |
| 4,602,269 | 7/1986 | Koike ........................ 357/42 |
| 4,612,458 | 9/1986 | Vasseghi et al. .......... 307/446 |
| 4,618,872 | 10/1986 | Baliga ...................... 327/566 |
| 4,682,054 | 7/1987 | McLaughlin .............. 307/446 |
| 4,701,642 | 10/1987 | Pricer ........................ 307/446 |
| 4,871,928 | 10/1989 | Bushey ...................... 307/446 |
| 4,880,998 | 11/1989 | Ueda .......................... 307/446 |
| 4,906,868 | 3/1990 | Maki et al. ................ 307/446 |
| 5,113,096 | 5/1992 | Lev et al. .................. 307/446 |
| 5,132,566 | 7/1992 | Denda ........................ 307/446 |
| 5,140,190 | 8/1992 | Yoo et al. .................. 307/446 |

*Primary Examiner*—Timothy P. Callahan
*Attorney, Agent, or Firm*—Skjerven Morrill MacPherson Franklin & Friel

[57] ABSTRACT

A pull-up output driver circuit includes a field effect transistor (FET) fabricated in a well region having a first conductivity type. The well region, in turn, is surrounded by a semiconductor region having a second conductivity type. The FET has a source connected to an output pad and a drain connected to a $V_{CC}$ voltage supply rail. The gate of the FET and the well region are connected to a driving circuit, and the semiconductor region is connected to the $V_{CC}$ voltage supply rail. A lateral bipolar transistor is formed by the drain, the source and the well region, and a vertical parasitic bipolar transistor is formed by the source, the semiconductor region and the well region. The driving circuit provides a signal (or signals) to the gate and well region to control the pull-up driver circuit. The FET turns on at a relatively low threshold voltage because the lateral bipolar transistor and the FET are turned on at substantially the same time.

18 Claims, 6 Drawing Sheets

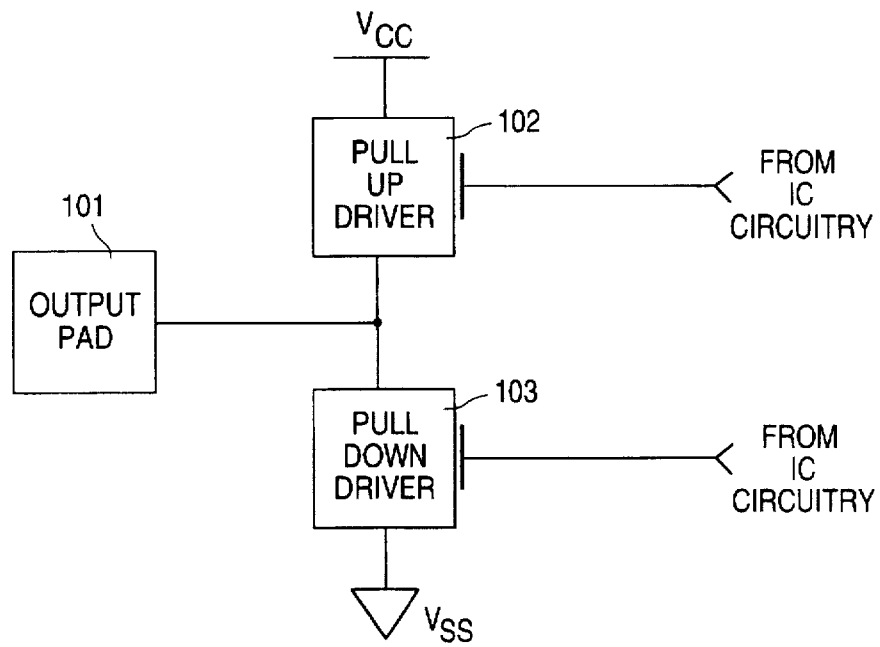
FIG. 1
(PRIOR ART)
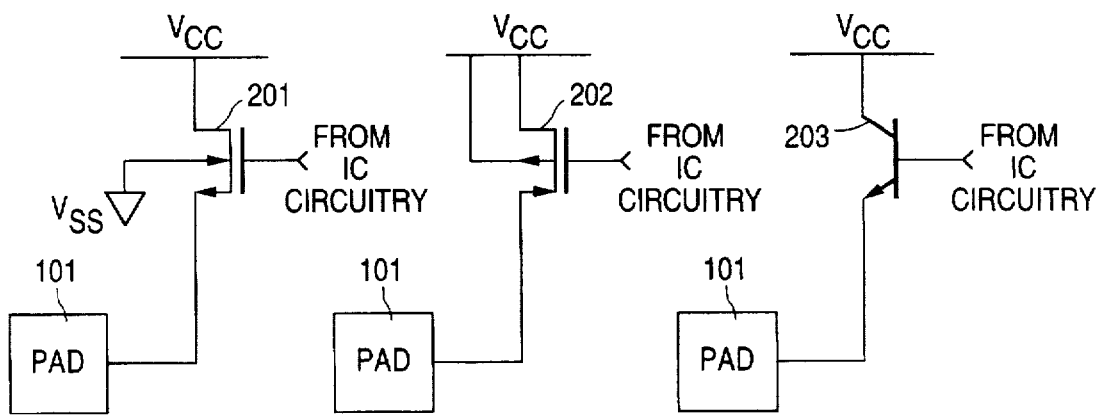
FIG. 2a
(PRIOR ART)
FIG. 2b
(PRIOR ART)
FIG. 2c
(PRIOR ART)

HIGH VOLTAGE TOLERABLE PULL-UP DRIVER AND METHOD FOR OPERATING SAME

FIELD OF THE INVENTION

The present invention relates to a semiconductor structure which includes a pull-up driver circuit.

BACKGROUND OF THE INVENTION

Most integrated circuits (IC's) include output pads which require one or more pull-up output drivers and one or more pull-down output drivers. The pull-up and pull-down drivers are controlled by circuitry on the IC to selectively connect the output pads to a $V_{CC}$ voltage supply rail (i.e., a voltage supply rail which receives a first voltage, $V_{CC}$, during normal operating conditions) and a $V_{SS}$ voltage supply rail (i.e., a voltage supply rail which receives a second voltage, typically ground, during normal operating conditions), respectively. FIG. 1 is a schematic diagram illustrating a typical output pad 101, an associated pull-up driver circuit 102, and an associated pull-down driver circuit 103.

FIGS. 2a–2c are schematic diagrams illustrating conventional pull-up driver circuits. FIG. 2a is a conventional NMOS pull-up driver circuit which includes NMOS field effect transistor 201. Transistor 201 has a drain coupled to the $V_{CC}$ voltage supply rail, a source coupled to output pad 101 and a gate coupled to IC circuitry which transmits signals to control the pull-up driver circuit. NMOS transistor 201 is fabricated in a p-well, which is coupled to the $V_{SS}$ (ground) voltage supply rail. Because the p-well is connected to ground, a positive back bias voltage is applied across the source and p-well of transistor 201 when transistor 201 is turned on. As a result, the threshold voltage (Vtb) of transistor 201 is relatively high. For example, in a 5 volt system (i.e., $V_{CC}$=5 volts +/–0.5 volts), the threshold voltage Vtb of transistor 201 can be as high as 2.0 volts.

As a result, when transistor 201 is turned on, the minimum voltage supplied to pad 101 can be as low as 2.5 volts. This minimum voltage exists when the $V_{CC}$ supply voltage is at the minimum value of 4.5 volts (i.e., 5 volts–0.5 volts) and a threshold voltage drop of 2.0 volts exists across transistor 201. The TTL specification requires a minimum voltage of 2.4 volts for the proper detection of a "high" signal. This minimum "high" voltage is designated Voh. The TTL Voh voltage requirement applies for all $V_{CC}$ supply voltages and all temperatures. Thus, transistor 201 is marginal in meeting the TTL Voh voltage requirement.

FIG. 2b illustrates a conventional PMOS pull-up driver circuit which includes PMOS field effect transistor 202. Transistor 202 has a drain coupled to the $V_{CC}$ voltage supply rail, a source coupled to output pad 101 and a gate coupled to IC circuitry which transmits signals to control the pull-up driver circuit. PMOS transistor 202 is fabricated in an n-well, which is coupled to the $V_{CC}$ voltage supply rail. If the voltage at pad 101 exceeds the voltage on the $V_{CC}$ supply rail by approximately 0.5 volts or more, current will undesirably flow from pad 101 to the $V_{CC}$ voltage supply rail through the forward biased P/N junction existing at the source/n-well interface. IC specifications typically require that the voltage at pad 101 be allowed to reach $V_{CC}$+0.5 volts. This shortcoming of PMOS transistor 201 is particularly detrimental when the $V_{CC}$ voltage supply rail has a voltage of 3.3 volts +/–0.3 volts, and the IC is to interface with another IC which is operated at a voltage of 5 volts +/–0.5 volts.

FIG. 2c illustrates a conventional bipolar pull-up driver which includes NPN bipolar transistor 203. Bipolar transistor 203 has a collector connected to the $V_{CC}$ voltage supply rail, an emitter connected to output pad 101 and a base connected to IC circuitry which controls the pull-up driver circuit. When bipolar transistor 203 is fabricated using a CMOS process, the response of transistor 203 is too slow to allow this transistor 203 to operate alone as a pull-up driver. Moreover, the threshold voltage of transistor 203 is approximately 0.8 volts. As a result, the voltage provided to pad 101 when transistor 203 is turned on can be as low as 2.2 volts in a 3.3 volt +/–0.3 volt system (i.e., 3.3 volts–0.3 volts–0.8 volts). As a result, the TTL requirement of Voh≧2.4 volts is not met.

Resistors can be added to pull-up driver circuit 102 as illustrated in FIG. 3. FIG. 3 shows a first resistor 301 connected between the $V_{CC}$ voltage supply rail and pull-up driver 102, and a second resistor 302 connected between output pad 101 and pull-up driver 102. In other circuits, only one of resistors 301 and 302 is used. Resistors 301 and 302 limit short circuit current through pull-up driver 102, prevent latch-up of pull-up driver 102 and limit the slew rate of pull-up driver 102.

It would therefore be desirable to have a pull-up driver circuit that (1) provides an adequate minimum Voh voltage for an output pad in both 5+/–0.5 volt and 3.3+/–0.3 volt TTL applications, (2) does not conduct current from the output pad to the $V_{CC}$ voltage supply rail in the presence of voltages at the output pad which exceed $V_{CC}$+0.5 volts, and (3) provides adequate switching speed.

SUMMARY

Accordingly, the present invention provides a pull-up output driver circuit having the advantages described above. In accordance with one embodiment of the invention, the pull-up driver circuit includes a field effect transistor (FET) fabricated in a well region. The well region is located in a first semiconductor region. The first semiconductor region has a first conductivity type and the well region has a second conductivity type opposite the first conductivity type.

The FET includes a drain region and a source region, each of the first conductivity type, located in the well region. A gate electrode is located over the drain and source regions. The source region is coupled to an output pad and the drain region is connected to a $V_{CC}$ voltage supply rail. The first semiconductor region is connected to the $V_{CC}$ voltage supply rail. A driving circuit is connected to the gate electrode and to the well region.

Two parasitic bipolar transistors are formed between the output pad and the $V_{CC}$ voltage supply rail, in parallel with the FET. A lateral parasitic bipolar transistor has an emitter formed by the source region, a collector formed by the drain region and a base formed by the well region. A vertical parasitic bipolar transistor has an emitter formed by the source region, a collector formed by the first semiconductor region and a base formed by the well region.

In one variation, the driving circuit generates a control signal having a first state and a second state. This control signal is applied to the gate of the FET and to the well region. When the control signal is in the first state, the field effect transistor, the lateral parasitic bipolar transistor and the vertical parasitic bipolar transistor are turned on, thereby providing a conductive path between the output pad and the voltage supply rail. The lateral bipolar transistor, being coupled in parallel with the FET, effectively reduces the threshold voltage of the FET when the pull-up driver circuit is turned on. Viewed in another way, the first state of the control signal creates a negative back bias voltage between the source region and the well region, thereby reducing the threshold voltage of the FET. As a result, the pull-up driver circuit provides an adequate minimum Voh voltage to the output pad in both 5+/−0.5 volt and 3.3+/−0.3 volt TTL systems.

When the control signal is in the second state, the field effect transistor, the lateral bipolar transistor and the vertical bipolar transistor are turned off, thereby isolating the output pad from the voltage supply rail. The second state of the control signal creates a positive back bias voltage between the source region and the well region, thereby increasing the threshold voltage of the FET.

Because the well region is not connected to the $V_{CC}$ voltage supply rail, the pull-up driver circuit does not conduct current from the output pad to the $V_{CC}$ voltage supply rail in the presence of voltages at the output pad which exceed $V_{CC}$+0.5 volts. In addition, because switching is performed by an FET, the pull-up driver circuit has an adequate switching speed.

In another variation, the driving circuit generates two control signals. A first control signal is applied to the gate electrode, and a second control signal is applied to the well region. In this variation, the first control signal controls the field effect transistor and the second control signal controls the lateral parasitic bipolar transistor and the vertical parasitic bipolar transistor. The timing of the first and second control signals is controlled to optimize the operation of the pull-up driver circuit.

The present invention also includes a method of operating the previously described pull-up driver circuit which includes the steps of: (1) applying a first voltage to the gate of the field effect transistor and to the well region, such that the first voltage applied to the gate turns on the field effect transistor, and the first voltage applied to the well region reduces the threshold voltage of the field effect transistor, and (2) applying a second voltage to the gate of the field effect transistor and to the well region, such that the second voltage applied to the gate turns off the field effect transistor, and the second voltage applied to the well region increases the threshold voltage of the field effect transistor.

The present invention also includes a method of fabricating the previously described pull-up driver circuit which includes the steps of (1) forming a first semiconductor region having a first conductivity type, (2) forming a first contact region of the first conductivity type in the first semiconductor region, (3) forming a well region of a second conductivity type in the first semiconductor region, (4) forming source and drain regions of the first conductivity type in the well region, (5) forming a second contact region of the second conductivity type in the well region, (6) forming a gate oxide layer over the well region, (7) forming a gate electrode over the gate oxide layer, (8) connecting the drain region and the first contact region to a voltage supply rail, (9) connecting the source region to an output pad, and (10) connecting the gate electrode and the second contact region to a driving circuit.

The present invention will be more fully understood in light of the following detailed description taken together with the drawings.

BRIEF DESCRIPTION OF THE DRAWINGS

FIG. 1 is a schematic diagram illustrating a conventional output pad and associated pull-up and pull-down drivers;

FIGS. 2a–2c are schematic diagrams illustrating conventional pull-up driver circuits;

DETAILED DESCRIPTION

Figure 3:
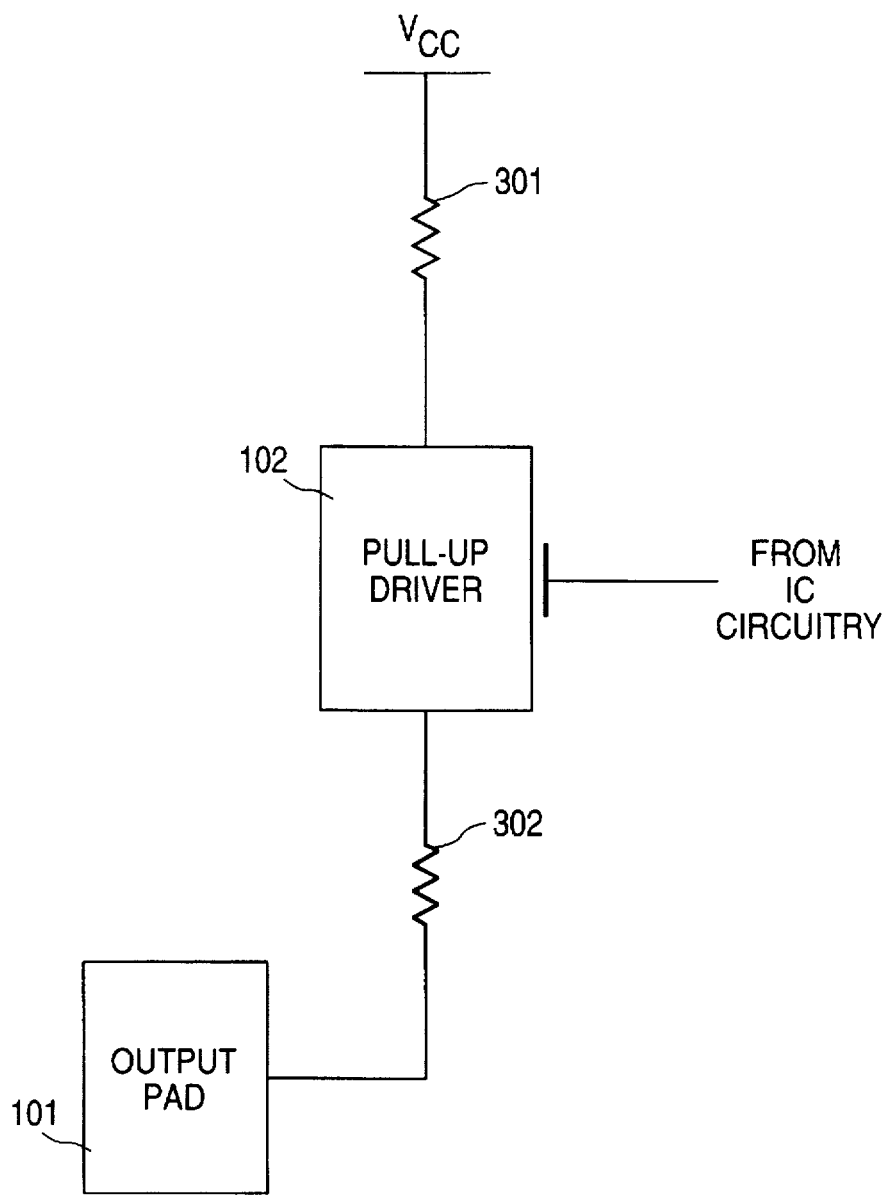
FIG. 3 is a schematic diagram of a conventional output driver circuit which includes resistors.
Figure 4:
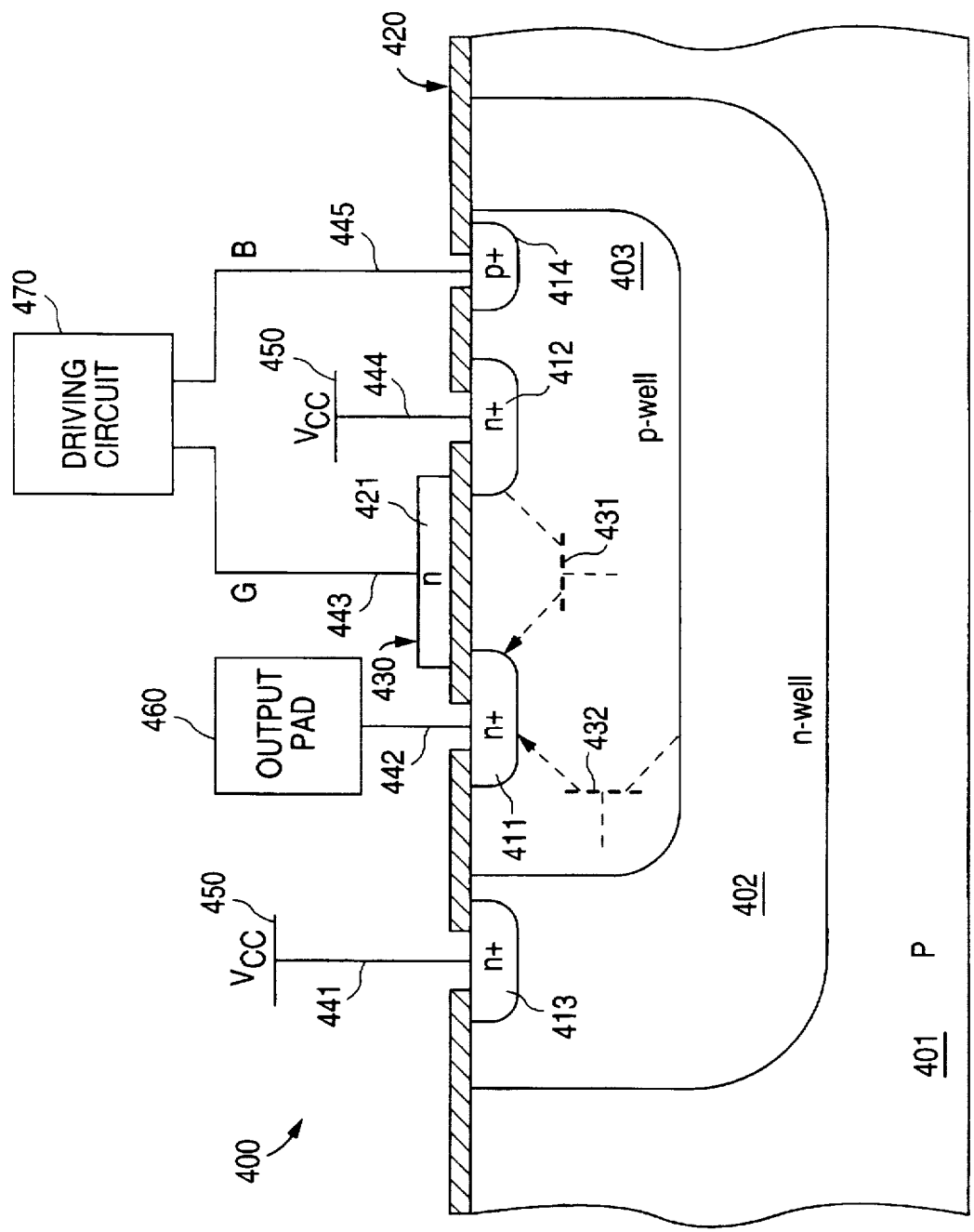
FIG. 4 is a cross sectional/schematic diagram of a pull-up driver circuit in accordance with one embodiment of the invention.

FIG. 4 is a cross sectional/schematic diagram of a pull-up driver circuit 400 in accordance with one embodiment of the invention. Pull-up driver circuit 400 includes monocrystalline semiconductor substrate 401, n-well region 402, p-well region 403, n+ source region 411, n+ drain region 412, n+ contact region 413, p+ contact region 414, gate oxide layer 420, gate electrode 421, electrically conductive leads 441–445, $V_{CC}$ voltage supply rail 450, output pad 460 and driving circuit 470. Substrate 401 can be either n-type or p-type.

The previously described structures of pull-up driver circuit 400 form n-channel field effect transistor (FET) 430, lateral parasitic NPN bipolar transistor 431 and vertical parasitic NPN bipolar transistor 432.

Pull-up driver circuit 400 can be fabricated in accordance with semiconductor processing steps known to one skilled in the art. In the example illustrated, n-well 402 is formed in p-type monocrystalline silicon substrate 401 using a conventional technique, such as ion implantation. Phosphorous can be implanted at an energy level of 80 KeV and a dose of approximately 1 to $3 \times 10^{12}$ ions/cm$^2$. Alternatively, a high energy implant can be performed using phosphorous at an energy level of 3 MeV and a dose of approximately 1 to $3 \times 10^{12}$ ions/cm$^2$. An anneal is then performed at 1150° C. for 17 hours. In another embodiment, pull-up driver circuit 400 is fabricated in an n-type substrate, thereby eliminating the need for n-well 402. In such an embodiment, n+ contact region 413 is formed in the n-type substrate.

Returning to the embodiment illustrated in FIG. 4, p-well 403 is formed within n-well 402 using a conventional technique, such as ion implantation. In a particular embodiment, p-well 403 is formed by performing several B+ implants at 30 to 380 KeV to generate a proper profile of approximately $10^{16}$ ions/cm$^3$. N-well 402 thereby isolates p-well 403 from p-type substrate 401. Gate oxide layer 420 is formed over the upper surface of the resulting structure using well known semiconductor processing techniques. Gate electrode 421, which is typically polysilicon, is formed on gate oxide 420 over p-well 403. N+ regions 411–413 are created using a conventional technique, such as ion implantation. For example, arsenic can be implanted at an energy of 150 KeV and a dose of approximately $5 \times 10^{15}$ ions/cm$^2$. An anneal is then performed at a temperature of 850° C. for 30 minutes. During the n+ ion implantation, gate electrode 421 is used as a mask. As a result, n+ regions 411 and 412 are aligned with gate electrode 421, and polysilicon gate electrode 421 is conductively doped. N+ regions 411 and 412 form the source and drain regions, respectively, of n-channel field effect transistor 430. Gate electrode 421 forms the gate of FET 430.

P+ contact region 414 is formed in p-well 403, again using a conventional technique such as ion implantation. For example, BF2+ can be implanted at an energy of 70 KeV and a dose of approximately 1 to $3 \times 10^{15}$ ions/cm$^2$. An anneal is then performed at 850° C. for 30 minutes. N+ region 413 and p+ region 414 provide contact regions for n-well 402 and p-well 403, respectively.

Conductive interconnect layers (not shown) are fabricated over the upper surface of the resulting structure in accordance with conventional techniques. These interconnect layers form electrically conductive leads 441–445. Leads 441 and 444 connect n+ contact region 413 and n+ drain region 412, respectively, to $V_{CC}$ voltage supply rail 450 (See, Step 511 of FIG. 6). Lead 442 connects n+ source region 411 to output pad 460. Leads 443 and 445 are connected to gate electrode 421 and p+ contact region 414, respectively. Leads 443 and 445 are coupled to driving circuit 470. Driving circuit 470 generates a gate control signal G and a bulk control signal B, which are provided to leads 443 and 445, respectively. Driving circuit 470 can be fabricated in substrate 401 or in another substrate (not shown).

Within the previously described structure, n+ source region 411, p-well 403 and n+ drain region 412 form the emitter, base and collector, respectively, of a parasitic lateral NPN bipolar transistor 431. In addition, n+ source region 411, p-well 403 and n-well 402 form the emitter, base and collector, respectively, of a parasitic vertical NPN bipolar transistor 432. As described in more detail below, these parasitic transistors 431 and 432 advantageously provide FET 430 with a relatively low threshold voltage during turn-on conditions.

Figure 5:
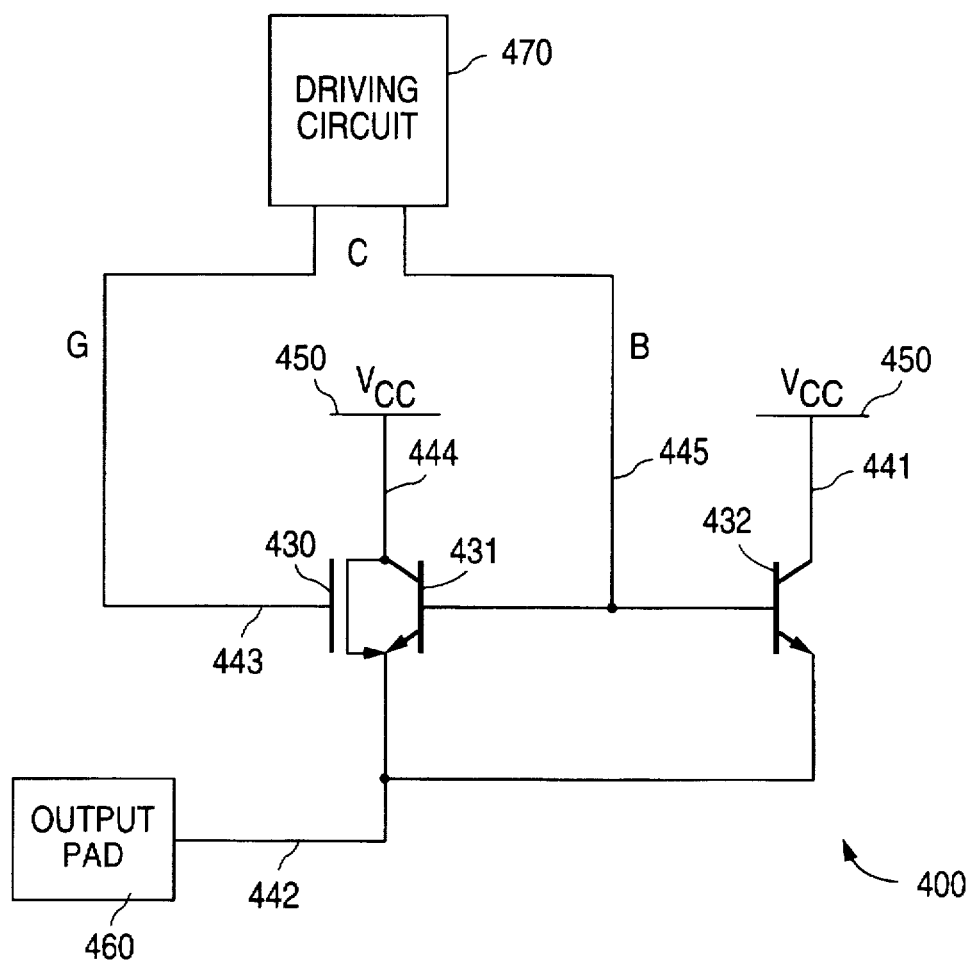
FIG. 5 is a schematic diagram of the pull-up driver circuit of FIG. 4.
Figure 6:
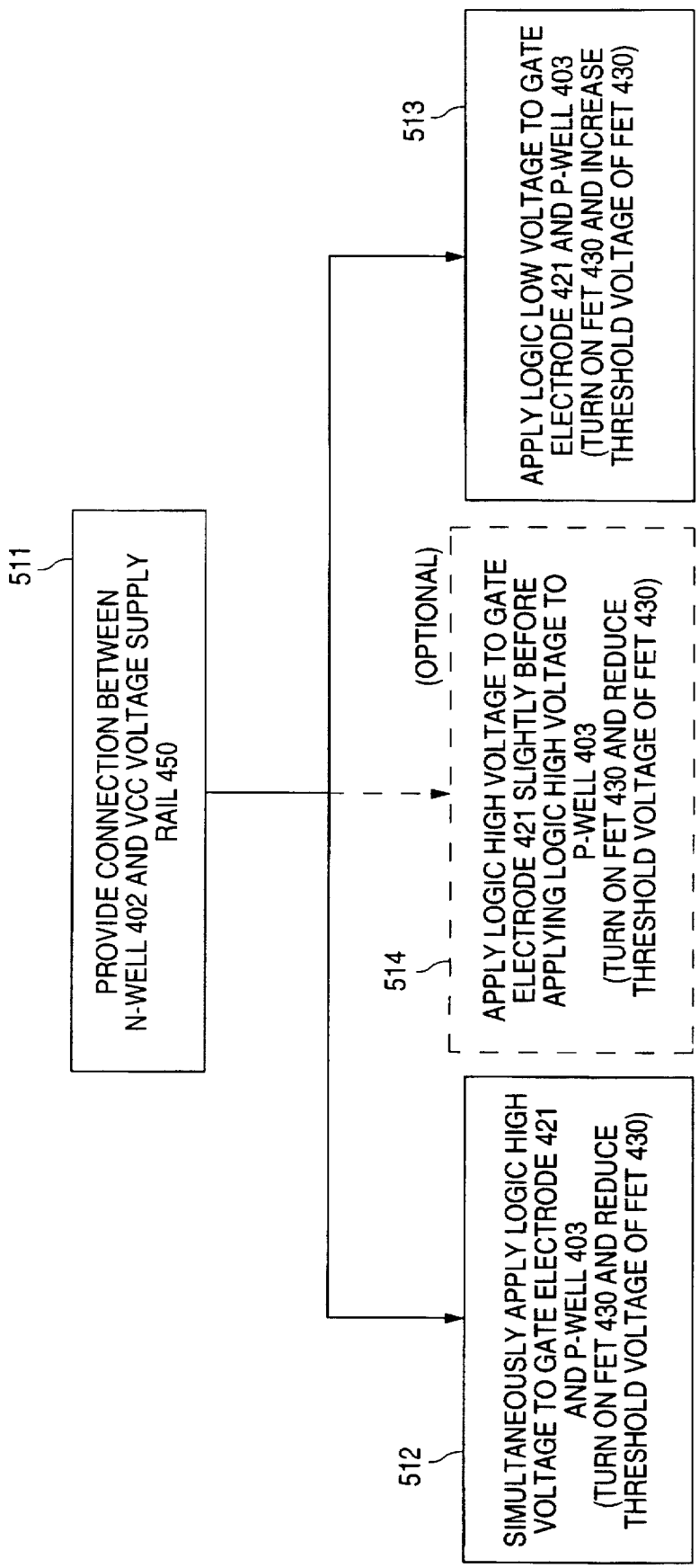
FIG. 6 is a flow diagram illustrating method steps in accordance with another embodiment of the invention.

FIG. 5 is a schematic diagram of pull-up driver circuit 400. As clearly illustrated in FIG. 5, n-channel FET 430, lateral NPN bipolar transistor 431 and vertical NPN bipolar transistor 432 are connected in parallel between $V_{CC}$ voltage supply rail 450 and output pad 460. Output driver circuit 400 operates as follows. FIG. 6 is a flow diagram illustrating steps in accordance with the invention. N-well region 402 is coupled to $V_{CC}$ voltage supply rail 450 by lead 441 and n+ contact region 413 in Step 511.

In one embodiment, driving circuit 470 provides the same control signal C to each of leads 443 and 445. That is, the gate control signal G is the same as the bulk control signal B. To connect output pad 460 to $V_{CC}$ voltage supply rail 450 (i.e., to turn on pull-up driver circuit 400), driving circuit 470 generates a logic high control signal C. (See, Step 512 of FIG. 6) When control signal C has a logic high voltage level, a logic high voltage is applied to the gate electrode 421 of FET 430 and to p-well 403 (i.e., to the base of each of bipolar transistors 431 and 432). The high voltage applied to gate electrode 421 causes FET 430 to turn on. Similarly, the high voltage applied to the bases of parasitic bipolar transistors 431 and 432 cause these transistors 431 and 432 to turn on. By turning on parasitic bipolar transistor 431, the threshold voltage Vtb of n-channel FET 430 is effectively reduced to approximately 0.3 volts. Viewed in another way, by applying a logic high voltage to both gate electrode 421 and p-well 403, a negative back bias voltage is created between p-well 403 and source region 411, thereby reducing the threshold voltage Vtb of FET 430.

By reducing the turn-on threshold voltage Vtb of FET 430 to approximately 0.3 volts, the minimum high output voltage Voh of pull-up driver circuit 400 is increased. For example, in a 3.3 volt+/−0.3 volt system, Voh is approximately 2.7 volts (i.e., 3.3 volts−0.3 volts−0.3 volts). Consequently, pull-up driver circuit 400 is able to meet the Voh voltage requirement of 2.4 volts for a TTL system.

To disconnect output pad 460 from $V_{CC}$ voltage supply rail 450 (i.e., to turn off pull-up driver circuit 400), driving circuit 470 generates a logic low control signal C. (See, Step 513 of FIG. 6) When control signal C has a logic low value, a logic low signal is applied to gate electrode 421 of FET 430 and to p-well 403 (i.e., to the base of each of bipolar transistors 431 and 432). The low voltage applied to gate electrode 421 causes FET 430 to turn off. Similarly, the low voltage applied to the bases of parasitic bipolar transistors 431 and 432 cause these transistors 431 and 432 to turn off. The low voltage applied to p-well 403 creates a positive back bias voltage between p-well 403 and source region 411, thereby increasing the threshold voltage Vtb of n-channel FET 430. As a result, when pull-up driver circuit 400 is turned off, leakage current is prevented from flowing through pull-up driver circuit 400.

Because FET 430 is an n-channel device, this pull-up driver circuit 400 will not inadvertently turn on when the voltage at the output pad 460 exceeds the voltage of $V_{CC}$ voltage supply rail 450 by 0.5 volts. Moreover, the switching speed of n-channel FET 430 is sufficient to support the proper operation of pull-up driver circuit 400. The rise time of FET 430 is typically a few volts per nanosecond.

In another embodiment, driving circuit 470 generates separate control signals, G and B, for each of leads 443 and 445. By driving leads 443 and 445 separately, driving circuit 470 can optimize the performance characteristics of pull-up driver circuit 400. In a specific example, when turning on pull-up driver circuit 400, gate control signal G is asserted high slightly before bulk control signal B is asserted high. (See, Step 514 of FIG. 6) By controlling signals G and B in this manner, excessive current is prevented from initially flowing in p-well 403. As a result, of the reduced current flowing in p-well 403, latch-up of pull-up driver circuit 400 is prevented.

Figure 7:
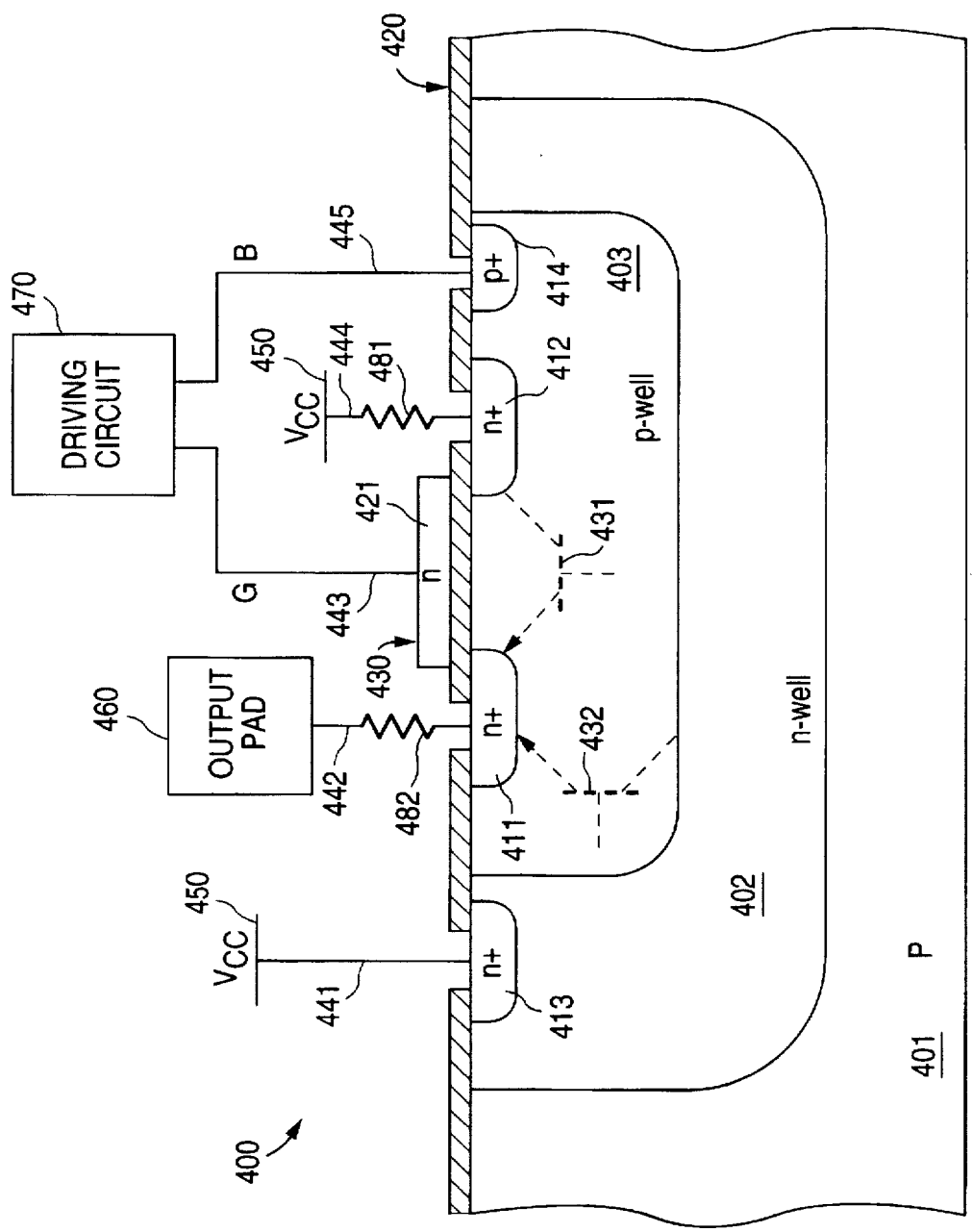
FIG. 7 is a cross sectional/schematic diagram of a pull-up driver circuit in accordance with an alternative embodiment of the invention.

Resistors can also be added to driver circuit 400 to prevent excessive short circuit currents and latch-up events and to reduce slew rates. To accomplish this, resistors are added, for example, along leads 442 and 444. Such resistors 481 and 482 are illustrated in FIG. 7.

Although the invention has been described in connection with several embodiments, it is understood that this invention is not limited to the embodiments disclosed, but is capable of various modifications which would be apparent to a person skilled in the art. For example, the specific conductivity types presented in the described embodiments can be reversed to achieve similar results. Thus, the invention is limited only by the following claims.

What is claimed is:

1. An output driver circuit comprising:
   a first semiconductor region having a first conductivity type;
   a well region located in the first semiconductor region, the well region having a second conductivity type opposite the first conductivity type;
   a field effect transistor having a drain region and a source region located in the well region, the drain and source regions each having the first conductivity type, and a gate electrode located over the drain and source regions;
   a lateral parasitic bipolar transistor having an emitter formed by the source region, a collector formed by the drain region and a base formed by the well region; and
   a driving circuit coupled to the well region, wherein the driving circuit applies a first voltage to the well region to reduce a threshold voltage of the field effect transistor and wherein the driving circuit applies a second voltage to the well region to increase the threshold voltage of the field effect transistor.

2. The output driver circuit of claim 1, further comprising a vertical parasitic bipolar transistor having an emitter formed by the source region, a collector formed by the first semiconductor region and a base formed by the well region.

3. The output driver circuit of claim 2, wherein the driving circuit generates a control signal having a first state and a second state, the driving circuit being connected to provide the control signal to the gate electrode and the well region, such that when the control signal is in the first state, the field effect transistor, the lateral parasitic bipolar transistor and the vertical parasitic bipolar transistor are turned on, and such that when the control signal is in the second state, the field effect transistor, the lateral bipolar transistor and the vertical bipolar transistor are turned off.

4. The output driver circuit of claim 2, wherein the driving circuit generates a first control signal having a first state and a second state, and a second control signal having a first state and a second state, wherein the first control signal is applied to the gate electrode and the second control signal is applied to the well region.

5. The output driver circuit of claim 4, wherein the field effect transistor is turned on in response to the first state of the first control signal, and the lateral parasitic bipolar transistor and the vertical parasitic bipolar transistor are turned on in response to the first state of the second control signal, and further wherein the field effect transistor is turned off in response to the second state of the first control signal, and the lateral parasitic bipolar transistor and the vertical parasitic bipolar transistor are turned off in response to the second state of the second control signal.

6. The output driver circuit of claim 1, wherein the first semiconductor region is a semiconductor substrate.

7. The output driver circuit of claim 1, further comprising a semiconductor substrate, wherein the first semiconductor region is a second well region located in the semiconductor substrate.

8. The output driver circuit of claim 1, further comprising:
a voltage supply rail; and
a resistor connected between the drain region and the voltage supply rail.

9. The output driver circuit of claim 1, further comprising:
an output pad; and
a resistor connected between the source region and the output pad.

10. The output driver circuit of claim 1, wherein the first conductivity type is n-type and the second conductivity type is p-type.

11. An output driver circuit comprising:
an output pad;
a voltage supply rail;
a field effect transistor having a gate, a source and a drain, wherein the source is connected to the output pad and the drain is connected to the voltage supply rail;
a lateral parasitic bipolar transistor having a base, a collector and an emitter, wherein the emitter of the lateral bipolar transistor is connected to the output pad and the collector of the lateral bipolar transistor is connected to the voltage supply rail;
a vertical parasitic bipolar transistor having a base, a collector and an emitter, wherein the emitter of the vertical bipolar transistor is connected to the output pad and the collector of the vertical bipolar transistor is connected to the voltage supply rail; and
a driving circuit connected to the gate of the field effect transistor, the base of the lateral bipolar transistor and the base of the vertical bipolar transistor.

12. A method of operating a field effect transistor as an output driver circuit, wherein the field effect transistor comprises a well region having a first conductivity type located in a semiconductor region having a second conductivity type opposite the first conductivity type, source and drain regions having the second conductivity type located in the well region, and a gate electrode located over the source and drain regions, wherein the drain region is connected to a voltage supply rail and the source region is connected to an output pad, the method comprising the steps of:
providing a connection between the semiconductor region and the voltage supply rail;
applying a first voltage to the gate of the field effect transistor and to the well region, such that the first voltage applied to the gate turns on the field effect transistor, and the first voltage applied to the well region reduces the threshold voltage of the field effect transistor; and
applying a second voltage to the gate of the field effect transistor and to the well region, such that the second voltage applied to the gate turns off the field effect transistor, and the second voltage applied to the well region increases the threshold voltage of the field effect transistor.

13. The method of claim 12, wherein the first voltage is simultaneously applied to the gate and well region.

14. The method of claim 12, wherein the first voltage is applied to the gate before the first voltage is applied to the well region.

15. An output driver circuit comprising:
a voltage supply rail;
a first semiconductor region having a first conductivity type and being coupled to the voltage supply rail;
a well region located in the first semiconductor region, the well region having a second conductivity type opposite the first conductivity type;
a field effect transistor having a drain region and a source region located in the well region, the drain and source regions each having the first conductivity type, and a gate electrode located over the drain and source regions, the drain region being connected to the voltage supply rail;
a lateral parasitic bipolar transistor having an emitter formed by the source region, a collector formed by the drain region and a base formed by the well region; and
a driving circuit coupled to the gate electrode and the well region.

16. A semiconductor circuit comprising:
a field effect transistor (FET) having a gate, a source and a drain; a first bipolar transistor having a base, collector and emitter, wherein the collector and the drain are formed by a first common semiconductor region, and the emitter and the source are formed by a second common semiconductor region;
a driving circuit coupled to the rate and the base; and
an output lead coupled to the second common semiconductor region.

17. The semiconductor circuit of claim 16, further comprising a second bipolar transistor having an emitter formed by the second common semiconductor region, and a base coupled to the driving circuit.

18. The semiconductor circuit of claim 17, wherein said first common semiconductor region and a collector of said second bipolar transistor are coupled to a voltage supply rail.

* * * * *